United States Patent [19]

Shimkunas et al.

[11] Patent Number: 4,708,919
[45] Date of Patent: Nov. 24, 1987

[54] PROCESS FOR MANUFACTURING A MASK FOR USE IN X-RAY PHOTOLITHOGRAPHY USING A MONOLITHIC SUPPORT AND RESULTING STRUCTURE

[75] Inventors: Alexander R. Shimkunas; James J. LaBrie, both of Palo Alto, Calif.

[73] Assignee: Micronix Corporation, Los Gatos, Calif.

[21] Appl. No.: 761,998

[22] Filed: Aug. 2, 1985

[51] Int. Cl.⁴ .......................... G03F 9/00; G03C 5/00; G21K 5/00
[52] U.S. Cl. ........................................ 430/5; 430/321; 430/966; 378/34; 378/35
[58] Field of Search .......................... 430/5, 321, 966; 378/34, 35

[56] References Cited

U.S. PATENT DOCUMENTS

| | | | |
|---|---|---|---|
| 3,742,230 | 6/1973 | Spears et al. | 250/65 R |
| 3,873,824 | 3/1975 | Bean et al. | 250/505 |
| 3,892,973 | 7/1975 | Coquin et al. | 250/505 |
| 4,171,489 | 10/1979 | Adams et al. | 250/510 |
| 4,198,263 | 4/1980 | Matsuda | 156/639 |
| 4,253,029 | 2/1981 | Lepselter et al. | 250/505 |
| 4,384,919 | 5/1983 | Casey | 156/645 |
| 4,393,127 | 7/1983 | Greschner et al. | 430/5 |
| 4,451,544 | 5/1984 | Kawabuchi | 430/5 |
| 4,515,876 | 5/1985 | Yoshihara et al. | 430/5 |
| 4,522,842 | 6/1985 | Levinstein et al. | 427/8 |
| 4,539,278 | 9/1985 | Williams et al. | 430/5 |
| 4,543,266 | 9/1985 | Matsuo et al. | 427/38 |
| 4,608,268 | 8/1986 | Shimkuna | 427/8 |

FOREIGN PATENT DOCUMENTS 75770 7/1978 Japan .
0015256 2/1980 Japan .......................... 378/35

OTHER PUBLICATIONS

Boron Nitride Structure for X-Ray Lithography J. Vac. Sci. Tech. 16(6) (Nov./Dec. 1979), pp. 1959–1961.
Buckley, W. D. et al., "X-Ray Lithography Mask Technology", J. Electrochem Soc: Solid State Science & Technology, May, 1981, vol. 128, No. 5, pp. 1116–1120.
Shimkunas, A. R., "Advances in X-Ray Mask Technology", Solid State Technology, Sep. 1984, pp. 192–199.
Block et al., U.S. Patent Application Ser. No. 06/761,993 filed 08/02/85 entitled "Method for Producing a Mask for use in X-Ray Photolithography and Resulting Structure".

Primary Examiner—John E. Kittle
Assistant Examiner—Patrick J. Ryan
Attorney, Agent, or Firm—Kenneth E. Leeds; Alan H. MacPherson; Paul J. Winters

[57] ABSTRACT

A process for manufacturing a mask for use in X-ray photolithography begins with a step of providing a glass disk (50) which is coated with a layer of boron nitride (52). The glass disk is about ¼ of an inch thick and about 4.5 to 6 inches in diameter. A circular portion (50a) of the boron nitride layer on one side of the glass disk is removed thus exposing a circular portion of the glass disk. The exposed portion of the glass disk is then removed, leaving a glass ring coated with a boron nitride membrane on one side. A layer of polyimide (54) and a layer of x-ray opaque substance (58) is deposited on the boron nitride membrane. The x-ray opaque substance is then patterned, the resulting structure being a mask which is used in X-ray photolithography.

21 Claims, 15 Drawing Figures

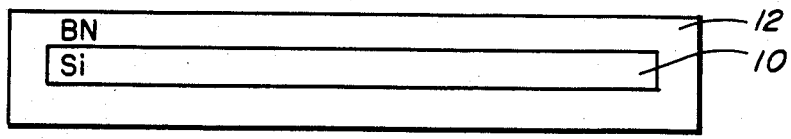
FIG._1a
(PRIOR ART)
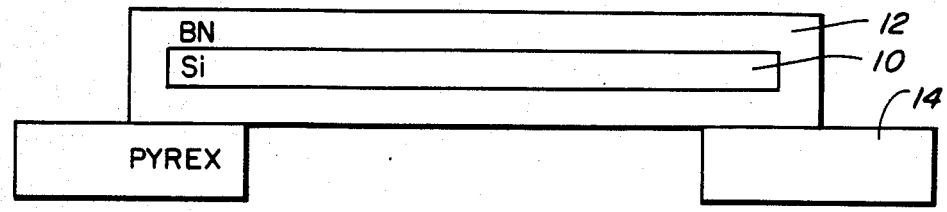
FIG._1b
(PRIOR ART)
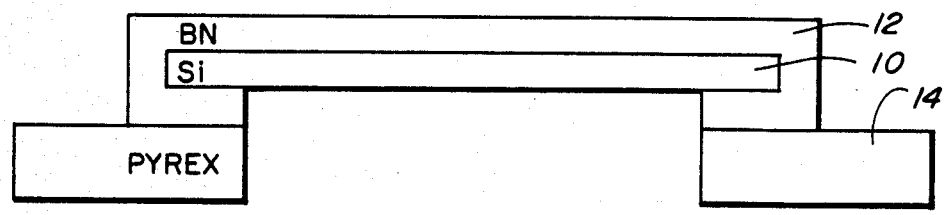
FIG._1c
(PRIOR ART)
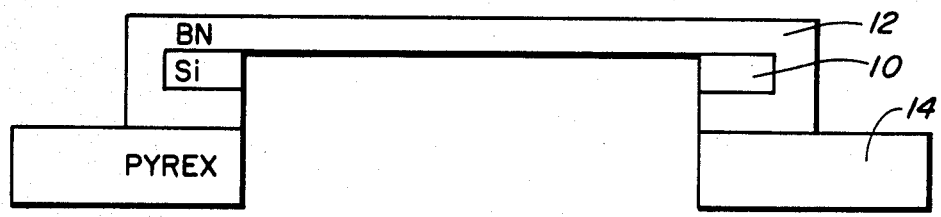
FIG._1d
(PRIOR ART)
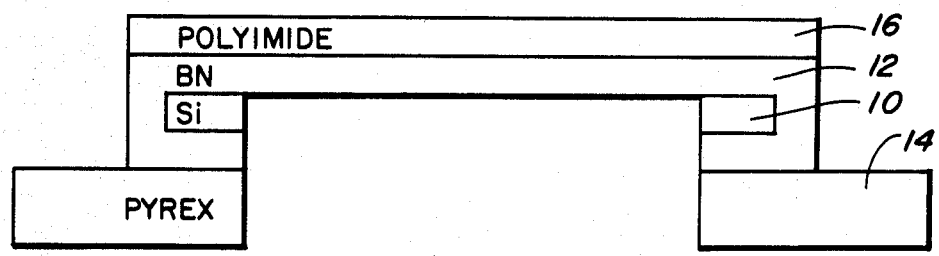
FIG._1e
(PRIOR ART)
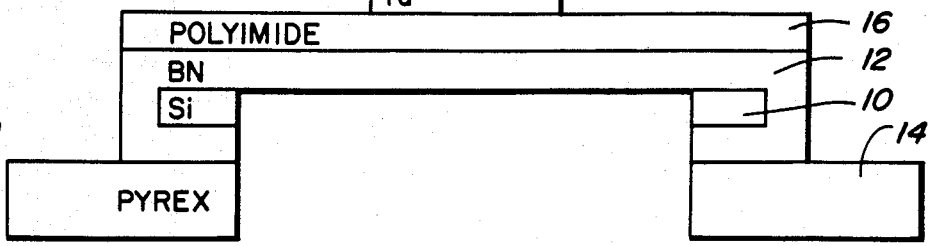
FIG._1f
(PRIOR ART)

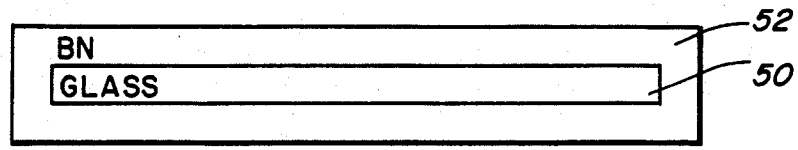
FIG._2a
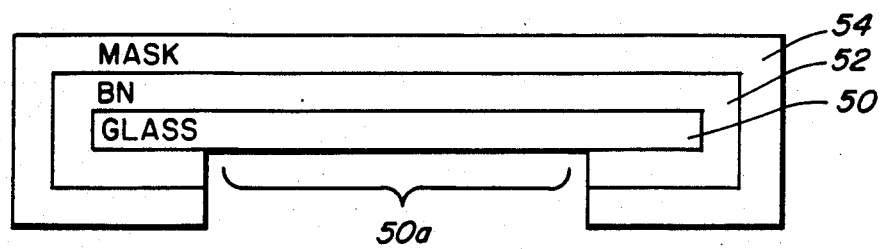
FIG._2b
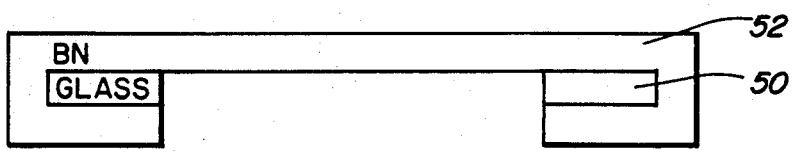
FIG._2c
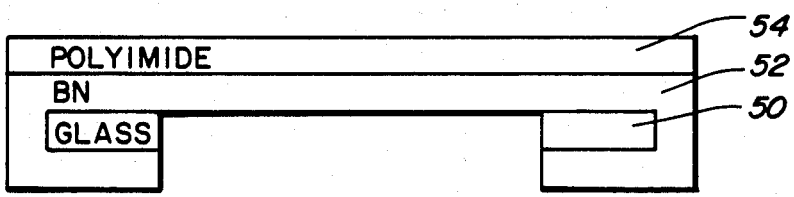
FIG._2d
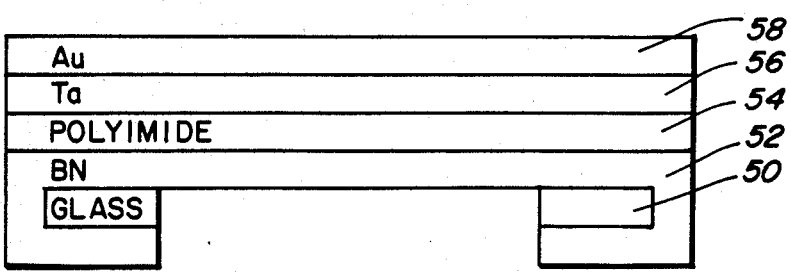
FIG._2e
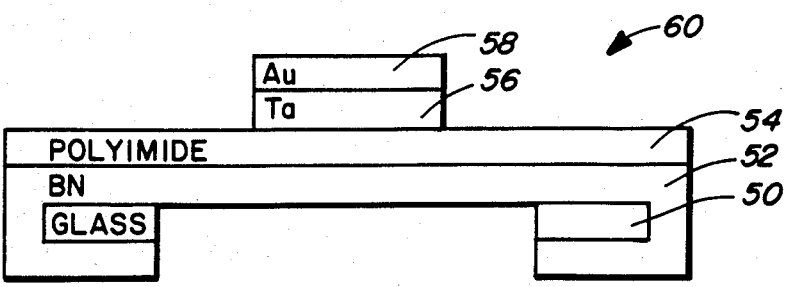
FIG._2f

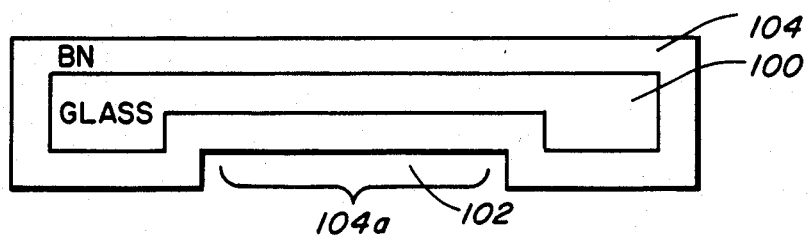
FIG._3a
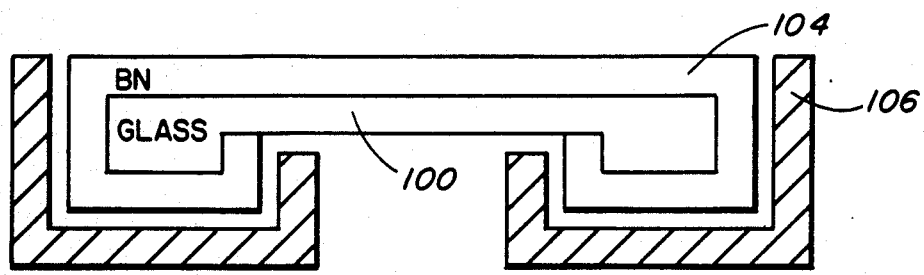
FIG._3b
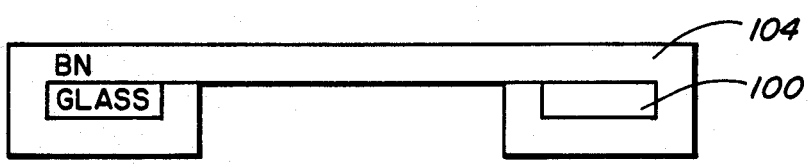
FIG._3c
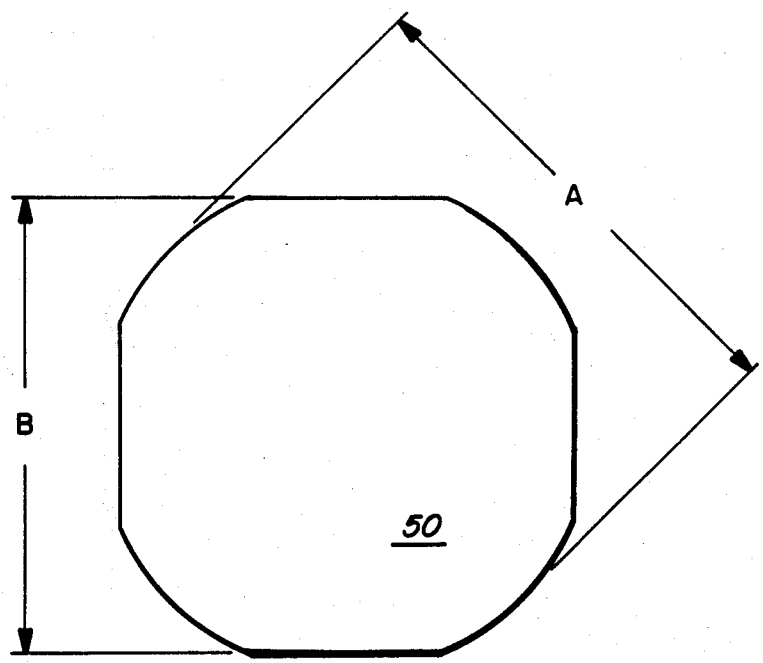
FIG._4

PROCESS FOR MANUFACTURING A MASK FOR USE IN X-RAY PHOTOLITHOGRAPHY USING A MONOLITHIC SUPPORT AND RESULTING STRUCTURE

BACKGROUND OF THE INVENTION

1. Field of the Invention

This invention relates to processes for manufacturing masks for use in x-ray photolithography and more specifically to processes used to manufacture masks which include an x-ray transparent membrane affixed to a support and the resulting structure.

2. Description of the Prior Art

It is known in the art to manufacture integrated circuits using photolithographic processes. In one such process, a wafer of semiconductor material, typically silicon, is covered with a photoresist layer. (Other semiconductor materials, e.g. gallium arsenide, are also used.) The photoresist layer is selectively exposed to light and thereafter developed. If the photoresist is positive resist, the exposed portions of photoresist are then removed, thus exposing portions of the silicon wafer. If the photoresist is negative resist, the unexposed portions of the photoresist are removed, thus exposing portions of the silicon wafer. The exposed portions of silicon wafer are then subjected to further processing to give to the silicon wafer desired electrical properties. It is known in the art to selectively expose portions of the photoresist by using a mask. Typical photolithographic processes use visible light to expose photoresist. It is known, however, that one can obtain finer resolution by using radiation having a wavelength shorter than that of visible light. For example, U.S. Pat. No. 3,743,842 issued to Smith et al. discusses a photolithographic process using radiation in the soft x-ray region of the spectrum.

Masks used in x-ray photolithography typically require an x-ray transparent membrane which supports a patterned layer of an x-ray opaque substance such as gold. A prior art process for manufacturing such a mask is illustrated in FIGS. 1a through 1f. Referring to FIG. 1a, all surfaces of a silicon substrate 10 are coated with a boron nitride layer 12 using a low pressure chemical vapor deposition process (LPCVD). The structure of FIG. 1a is then bonded to a pyrex ring 14 using, for example, an epoxy adhesive as illustrated in FIG. 1b. Referring to FIG. 1c, a circular portion of boron nitride layer 12 on the surface of the silicon adjacent the pyrex ring is removed using any of a number of processes (e.g., a chemical or reactive ion etch) thus exposing a portion of silicon substrate 10.

Referring to FIG. 1d, the portion of silicon substrate 10 exposed by removal of boron nitride is in turn removed, e.g., by a KOH etch. The resulting structure consists of a boron nitride membrane 12 covering a silicon ring 10 which is bonded to a pyrex ring 14. The boron nitride membrane 12 is typically coated with a polyimide layer 16 which provides added mechanical support to boron nitride membrane 12 (FIG. 1e). In addition, subsequently deposited tantalum adheres better to polyimide layer 16 than to boron nitride. Thereafter, a tantalum layer 18 and a gold layer 20 are deposited on polyimide layer 16 and patterned (FIG. 1f). As is known in the art, gold is x-ray opaque and tantalum permits gold layer 20 to adhere to polyimide layer 16. The resulting structure is a mask for use in x-ray photolithography. Although this process provides adequate masks, it is complicated and expensive.

SUMMARY

A process in accordance with the present invention includes the step of coating a glass disk on both sides with a layer of boron nitride. A circular hole is etched in the boron nitride layer on one side of the glass disk thus exposing a circular portion of the glass disk. In one embodiment, this is done by using an air abrasive tool as described below. The exposed portion of the glass disk is then removed, leaving a glass ring with a boron nitride membrane formed thereon. Thereafter, a layer of polyimide, a layer for tantalum (which bonds to both polyimide and gold—an x-ray opaque substance), and a layer of gold are formed on the boron nitride membrane. The gold and tantalum layers are then patterned and the resulting structure is a mask for use in x-ray photolithography. Thus, the process of the present invention provides a boron nitride membrane stretched across a glass disk without the necessity of using a sacrificial silicon substrate such as substrate 10 described above in the discussion of the prior art. Because of this, the process of the present invention is simplified and less expensive than prior art mask manufacturing techniques. In addition, the structure produced by the present invention is easier to inspect for defects.

The mask of the present invention includes a boron nitride membrane that is flatter than in prior art masks. This is because the shape of prior art x-ray transparent membranes, e.g. membrane 12 of FIG. 1f, reflects irregularities in the shape of silicon ring 10, pyrex ring 14, and the epoxy used to bond pyrex ring 14 to boron nitride 12. The boron nitride membrane of the present invention has a shape which only reflects irregularities in the shape of the glass disk.

The mask of the present invention is simpler to handle in an E-beam imaging system. This is because the height of the top surface of the prior art mask of FIG. 1f is substantially displaced from the height of pyrex ring 14. The mask of the present invention includes no such height displacement.

BRIEF DESCRIPTION OF THE DRAWING

FIGS. 1a through 1f illustrate in cross section a mask during a prior art manufacturing process.

FIGS. 2a through 2e illustrate in cross section a mask during a manufacturing process in accordance with one embodiment of the present invention.

FIGS. 3a through 3c illustrate in cross section a mask during the manufacturing process of another embodiment of the present invention.

FIG. 4 illustrates in plan view a glass disk used in one embodiment of the invention.

DETAILED DESCRIPTION

The process for manufacturing a mask in accordance with the present invention starts by coating all surfaces of a disk constructed from a first material with a layer of x-ray transparent material. In one embodiment, the x-ray transparent membrane is boron nitride. A portion of the x-ray transparent material on one side of the disk is removed thus exposing a portion of the disk. The exposed portion of the disk is then removed, thus leaving a ring supporting an x-ray transparent membrane. The boron nitride membrane is subsequently used to support a patterned layer of x-ray opaque material. Of importance, the ring is of sufficient thickness and diameter to serve as a mechanical support for the mask being constructed without the need to affix the ring to a larger support structure such as the prior art pyrex ring 14 shown in FIGS. 1b to 1f. The membrane is then coated with a material such as polyimide which adds mechanical strength to the membrane, a layer of material which adheres to both the polyimide and an x-ray opaque substance, and a layer of x-ray opaque substance. The layer of x-ray opaque substance is then patterned, the resulting structure being a mask suitable for use in x-ray photolithography.

The process of one embodiment of the present invention starts by coating a glass disk 50 with a boron nitride layer 52 (FIG. 2a). Glass disk 50 typically has a diameter of 6 inches (dimension A in the plan view of FIG. 4) and a thickness of ¼ inches. In one embodiment, disk 50 has four flats 51 as illustrated in FIG. 4. The distance between the flats is 5.5 inches (dimension B of FIG. 4). However, disks without flats and disks with other dimensions can also be used. In addition, other shapes, e.g. square shaped pieces of glass, can be used.

Glass disk 50 is either borosilicate or fused silica. Boron nitride layer 52 is typically formed by a LPCVD process which takes place at about 340° C. and uses $NH_3$ flowing at 25 to 30 SCCM, $B_2H_6$ flowing at 60 to 70 SCCM, and $N_2$ flowing at 540 to 600 SCCM. (1 SCCM is 1 cubic centimeter per minute at one atmosphere of pressure.) Instead of using $N_2$, one can also use helium. Layer of boron nitride 52 is formed to a thickness of approximately 3 to 5 microns. As will hereinafter become apparent, boron nitride layer 52 will subsequently be used to form a membrane which serves as a support for an x-ray opaque substance.

Thereafter, boron nitride layer 52 is covered with a masking material 54 such as a thick photoresist layer (FIG. 2b). An opening in masking material 54 is formed on one side of glass disk 50 by conventional lithographic techniques thereby exposing a portion of boron nitride layer 52. The exposed portion of boron nitride layer 52 is then removed, e.g., by a barrel plasma or chemical etch, thus exposing a portion 50a of glass disk 50. Referring to FIG. 2c, masking layer 54 is removed by soaking the mask in a solvent which dissolves photoresist. (In other embodiments, instead of using photoresist as a mask when etching boron nitride layer 52, a mechanical masking fixture is used).

Exposed portion 50a of glass disk 50 is removed via an etching process. In one embodiment of the invention, portion 50a of glass disk 50 is removed by soaking boron nitride coated disk 50 in a solution of 70% HF and 30% $HNO_3$ at 70° C. In an alternative embodiment, boron nitride coated glass disk 50 is soaked in a 100% HF solution at 70° C. until exposed portion 50a of glass disk 50 is dissolved. (The above listed percentages refer to standard reagent concentrations, i.e. a 100% HF solution is 49% HF by weight and a 100% $HNO_3$ solution is 70% $HNO_3$ by weight). The resulting structure is illustrated in FIG. 2c.

Thereafter, boron nitride membrane 52 is annealed to achieve a desired tension. This is typically done by heating boron nitride membrane 52 to a temperature approximately 40° C. greater than the temperature (340° C.) at which it was deposited, which increases the tensile stress in boron nitride membrane 52. In one embodiment of the invention, boron nitride membrane 52 is annealed to achieve a tension between $6 \times 10^8$ and $10 \times 10^8$ dynes per $cm^2$.

In accordance with one embodiment of the invention, the tension in boron nitride membrane 52 is measured before annealing by a process such as the one described in copending application Ser. No. 06/761,993, filed Aug. 2, 1985, on an invention of Barry Block and Alexander R. Shimkunas, entitled "Method For Producing A Mask For Use In X-Ray Photolithography And Resulting Structure", which is hereby incorporated by reference. The annealing time is selected in response to the measured tension. After annealing, the tension in boron nitride membrane 52 is measured again to ascertain whether additional annealing is required. The annealing time is typically 60 minutes.

If additional annealing is not required, the boron nitride membrane is covered with a layer of polyimide 54, e.g., by spinning on a layer of polyimide precursor such as Pyralin model number 2555 available from DuPont. The precursor is then cured by heating the precursor at about 250° C. for about 120 minutes, leaving the structure illustrated in FIG. 2d. Thereafter, the polyimide layer 54 is coated with a tantalum layer 56 and a gold layer 58. In one embodiment of the invention, tantalum layer 56 and gold layer 58 are sputtered onto polyimide layer 54 to a thickness of 300 Å and 6000 Å respectively (FIG. 2e). Thereafter, the gold and tantalum layers 56 and 58 are patterned using conventional techniques such as the ones discussed in "Advances in X-Ray Mask Technology" by Alexander R. Shimkunas, published in the September 1984 issue of Solid State Technology, pages 192 to 199, which is incorporated herein by reference. The resulting structure is a mask such as mask 60 illustrated in FIG. 2f.

In one alternative embodiment, instead of using glass disk 50, a ¼ inch thick silicon disk having a 6 inch diameter is used. The process continues as described above, except instead of using an HF—$HNO_3$ etchant to etch a circular portion of the disk, the boron nitride coated silicon disk is soaked in a KOH solution having a concentration of 20% by weight and a temperature of 95° C. In the alternative, a 20% HF–40% $HNO_3$–40% acetic acid etchant at room temperature can also be used to etch the silicon disk. (A 100% acetic acid solution is 99% $CH_3OOH$ by weight.)

Referring to FIG. 3a, in accordance with another embodiment of the invention, a glass disk 100 with a cavity 102 formed therein is coated on all surfaces with a boron nitride layer 104. A portion 104a of boron nitride layer 104 is removed, e.g., by covering the structure of FIG. 3a with a mechanical masking fixture 106 (FIG. 3b). Portion 104a of boron nitride layer 104 is then removed, e.g., by using an air abrasive tool, such as Model No. 6500 manufactured by S. S. White Industrial Products of Piscataway, N.J. An abrasive tool propels sodium bicarbonate particles at exposed portion 104a of boron nitride layer 104. The sodium bicarbonate particles are a type such as part number 354-1620Y, also available from S. S. White Industrial Products.

The process of removing exposed portion 104a exposes a portion of glass disk 100. The exposed portion of glass disk 100 is then removed (FIG. 3c) using either HF or an HF-$HNO_3$ solution as described above. Boron nitride membrane 104 is then annealed and coated with polyimide, tantalum, and gold as described above, and the gold and tantalum layers are patterned to form a mask using the same steps described in the previous embodiment.

While the invention has been described with reference to specific embodiments, those skilled in the art will recognize that modifications can be made in form and detail without departing from the spirit and scope of the invention. Accordingly, all such changes come within the scope of the present invention.

What is claimed is:

1. A process for manufacturing a mask comprising the steps of:
   providing a support member of a first material;
   covering said output member with a layer of x-ray transparent material;
   removing a portion of said support member after said step of covering said support member; and
   forming a patterned layer of x-ray opaque material on said layer of x-ray transparent material, the remaining portion of said first material providing mechanical support for said layer of x-ray transparent material such that said remaining portion of said first material remains substantially flat without the need for bonding said remaining portion to an additional support.

2. A mask comprising:
   a support member of a first material having a hole therein, said support member having a top surface, said hole extending through said top surface, said support member having a thickness greater than or equal to a first value, said first value being on the order of approximately ¼ inches;
   an x-ray transparent membrane formed directly on said top surface, a portion of said membrane extending over said hole, said portion of said membrane over said hole being coplanar with a portion of said membrane formed directly on said top surface; and
   a patterned layer of x-ray opaque material formed on said membrane, said support member providing mechanical support for said membrane.

3. A process for manufacturing a mask comprising the steps of:
   providing a support member of a first material, said support member having a surface, said support member having a thickness greater than or equal to a first value, said first value being on the order of approximately ¼ inches;
   growing an x-ray transparent layer directly on said surface;
   removing a portion of said support member in contact with said x-ray transparent layer, thereby forming a hole in said support member, said hole extending through said support member, the portion of said x-ray transparent layer previously in contact with said removed portion extending over said hole; and
   forming a patterned layer of x-ray opaque material on said layer of x-ray transparent material.

4. The process of claim 3 wherein said x-ray transparent layer is grown on said surface with a chemical vapor deposition process.

5. The process of claim 1 wherein said x-ray transparent material is under a tension greater than or equal to $6 \times 10^8$ dynes/cm$^2$ at the conclusion of said process.

6. A process for manufacturing a mask comprising the steps of:
   providing a support member of a first material, said support member having a thickness greater than or equal to a first value, said first value being on the order of approximately ¼ inches;
   covering said support member with a layer of x-ray transparent material;
   removing a portion of said support member after said step of covering said support member; and
   forming a patterned layer of x-ray opaque material on said layer of x-ray transparent material.

7. The process of claim 6 wherein said layer of x-ray transparent material is under tensile stress, the remaining portion of said first material being strong enough to remain substantially flat despite said stress in said x-ray transparent material.

8. A process for manufacturing a mask comprising the steps of:
   providing a support member of a first material, said support member having a first side and a second side, said support member having a cavity formed in said second side, said cavity extending through only a portion of the thickness of said support member;
   covering said first side with a layer of x-ray transparent material;
   removing a portion of said support member adjacent to said cavity after said step of covering said first side; and
   forming a patterned layer of x-ray opaque material on said layer of x-ray transparent material.

9. The process of claim 8 wherein said portion of said support member remaining after said step of removing a portion is sufficiently strong so that said remaining portion remains substantially flat without the need to bond said remaining portion to an additional support structure.

10. A process for manufacturing a mask comprising the steps of:
    providing a support member of a first material;
    covering said support material with a layer of x-ray transparent material;
    removing a portion of said layer of x-ray transparent material with an air abrasive tool, thereby exposing a portion of said support member;
    removing said exposed portion of said support member; and
    forming a patterned layer of x-ray opaque material on said layer of x-ray transparent material, said x-ray transparent material being under tensile stress, said remaining portion of said support member being strong enough to remain substantially flat despite said stress in said x-ray transparent material.

11. A process for manufacturing a mask comprising the steps of:
    providing a support member of a first material, said support member having a first surface, said first surface having a width equal to a first value, said support member having a thickness equal to a second value, the ratio of said first value to said second value being less than or equal to a third value, said third value being on the order of approximately 24;
    covering said first surface with a layer of x-ray transparent material;
    removing a portion of said first material after said step of covering said first surface; and
    forming a patterned layer of x-ray opaque material on said layer of x-ray transparent material.

12. The process of claim 11 wherein said layer of x-ray transparent material is under tensile stress, the portion of said first material remaining after said step of removing a portion being strong enough so that said remaining portion remains substantially unbowed despite said stress in said layer of x-ray transparent material.

13. A process for manufacturing a mask comprising the steps of:
   providing a support member having a surface;
   covering said surface with an x-ray transparent layer, the ratio of the thickness of said support member to the thickness of said x-ray transparent layer being greater than or equal to a value, said value being on the order of approximately 1270;
   removing a portion of said support member after said step of covering said surface; and
   forming a patterned x-ray opaque layer on said x-ray transparent layer.

14. The process of claim 13 wherein said x-ray transparent layer is under a tensile stress, the portion of said support member remaining after said step of removing a portion being strong enough to remain substantially flat despite said stress in said x-ray transparent layer.

15. A mask comprising:
   a support member of a first material having a hole therein, said support member having a top surface, the ratio of the width of said top surface to the thickness of said support member being less than or equal to a value, said value being on the order of approximately 24;
   an x-ray transparent membrane formed directly on said top surface, a portion of said membrane extending over said hole, said portion of said membrane extending over said hole being coplanar with a portion of said membrane formed directly on said top surface; and
   a patterned layer of x-ray opaque material formed on said membrane.

16. The mask of claim 15 wherein said membrane is under a tensile stress, said support member being strong enough to remain substantially flat despite said stress in said membrane.

17. A mask comprising:
   a support member of a first material having a hole therein, said support member having a top surface, said hole extending through said top surface;
   an x-ray transparent membrane formed directly on said top surface, a portion of said membrane extending over said hole, said portion of said membrane extending over said hole being coplanar with the portion of said membrane formed directly on said top surface, the ratio of the thickness of said support member to the thickness of said membrane being greater than or equal to a value, said value being on the order of approximately 1270; and
   a patterned layer of x-ray opaque material formed on said membrane.

18. The mask of claim 17 wherein said membrane is under a tensile stress, said support member being strong enough to remain substantially flat despite said tensile stress.

19. The mask of claim 2 wherein said membrane comprises boron nitride.

20. The mask of claim 15 wherein said membrane comprises boron nitride.

21. The mask of claim 17 wherein said membrane comprises boron nitride.

* * * * *